(12) United States Patent
Nishimura

(10) Patent No.: US 6,563,203 B2
(45) Date of Patent: May 13, 2003

(54) MOTOR DRIVING DEVICE

(75) Inventor: Kazuhiko Nishimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/726,563

(22) Filed: Dec. 1, 2000

(65) Prior Publication Data
US 2001/0002723 A1 Jun. 7, 2001

(30) Foreign Application Priority Data
Dec. 7, 1999 (JP) .......................... 11-347195

(51) Int. Cl.$^7$ ............................ H01L 23/495
(52) U.S. Cl. ............. 257/676; 257/666; 257/723; 257/672; 361/808; 361/813; 361/820; 438/111; 438/112; 438/123
(58) Field of Search ................. 257/666, 667–677, 257/723; 361/808, 813, 820; 438/111, 112, 123, 127, 106, 107, 110

(56) References Cited
U.S. PATENT DOCUMENTS 4,855,257 A * 8/1989 Kouda ............... 438/542
6,184,585 B1 * 2/2001 Martinez et al. ........... 257/777
6,313,598 B1 * 11/2001 Tamba et al. .............. 318/722

FOREIGN PATENT DOCUMENTS

| JP | 60081877 A | * | 5/1985 |
| JP | 04167568 A | * | 6/1992 |
| JP | 04354386 A | * | 12/1992 |
| JP | 06342818 A | * | 12/1994 |

* cited by examiner

Primary Examiner—Eddie Lee
Assistant Examiner—Chris C. Chu
(74) Attorney, Agent, or Firm—Arent Fox Kintner Plotkin & Kahn

(57) ABSTRACT

In a motor driving device, an IC chip of a drive circuit for driving a motor is die-bonded to one island of a leadframe, and a diode chip of a protection diode for preventing the drive circuit from being destroyed when supplied power is connected to the IC chip with reverse polarities is die-bonded to another island of the leadframe. The supplied-power pad of the IC chip is wire-bonded to the second island, which serves as the cathode electrode of the diode chip.

3 Claims, 2 Drawing Sheets

MOTOR DRIVING DEVICE

BACKGROUND OF THE INVENTION

1. Field of the Invention

The present invention relates to a motor driving device.

2. Description of the Prior Art

Motor driving devices are known that are provided with a drive circuit for driving a motor and a protection diode for preventing the drive circuit from being destroyed when a power source is connected thereto with reverse polarities. FIG. 2 shows an example of a circuit configuration of an output stage of a pre-drive circuit 1 for a two-phase half-wave fan motor. A MOS-type field-effect transistor (or bipolar transistor) 100 an a resistor 200 are connected in series between a supplied-power terminal T1 and a ground terminal T2. A node between the transistor 100 and the resistor 200 is connected to an output terminal T3.

In actual use, to the output terminal T3, the base of an NPN-type power transistor 3 is connected through resistor 6. The transistor 3 has its emitter grounded, and has its collector connected to one end of a coil 4 of a fan motor. The other end of the coil 4 is connected to a cathode of a diode 5. An anode of the diode 5 is connected to a supplied voltage $V_{cc}$.

With a motor driving device provided with the pre-drive circuit 1 as described above, there is a risk of a power source being connected thereto with reverse polarities, for example, as a result of improper insertion of a connector. Therefore, to prevent destruction, resulting from reverse connection of a power source, of the circuit elements, such as the MOS transistor 100, constituting the pre-drive circuit 1, it has been customary to connect to the supplied-power terminal T1 of the pre-drive circuit 1 the cathode of a protection diode 2 of which the anode is connected to a terminal (not shown) to which the supplied power is supplied.

Here, the current that flows into the base of the transistor 3 to drive the motor is supplied directly from the power source, and therefore the protection diode 2 needs to have a high current capacity. In general, however, it is difficult to obtain a satisfactorily high current capacity with a diode formed within an IC (integrated circuit). For this reason, usually, in FIG. 2, whereas the pre-drive circuit 1 is formed as a one-chip IC, the protection diode 2 is connected externally to the IC. As a result, conventional motor driving devices provided with a pre-drive circuit and a protection diode has the disadvantage of requiring an unduly large mounting area and also requiring an extra assembly step.

The same problem is addressed by Japanese Patent Application Laid-Open No. H7-130927, which proposes, as a solution, mounting a MOS transistor and a diode on a single island. However, this is possible only with a single MOS transistor; that is, with a common IC, which is not formed on a single substrate together with a diode, it is impossible to mount the IC and the diode on a single island.

SUMMARY OF THE INVENTION

An object of the present invention is to provide a motor driving device that, despite being provided with a drive circuit for driving a motor and a protection diode, requires a reduced mounting area and a reduced number of assembly steps.

To achieve the above object, according to the present invention, a motor driving device is provided with: an IC chip incorporating a circuit for driving a motor; a diode chip provided in a power-supply path through which electric power is supplied to the IC chip; a leadframe having a first island on which the IC chip is mounted and a second island on which the diode chip is mounted; a wire connecting together a supplied-power island provided on the IC chip and the second island; and a package incorporating the leadframe, the IC chip, and the diode chip.

This structure eliminates the need to connect a protection diode externally. Moreover, this structure makes it possible to obtain not only a higher current capacity but also a higher peak inverse voltage in the protection diode than when it is formed within an IC.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
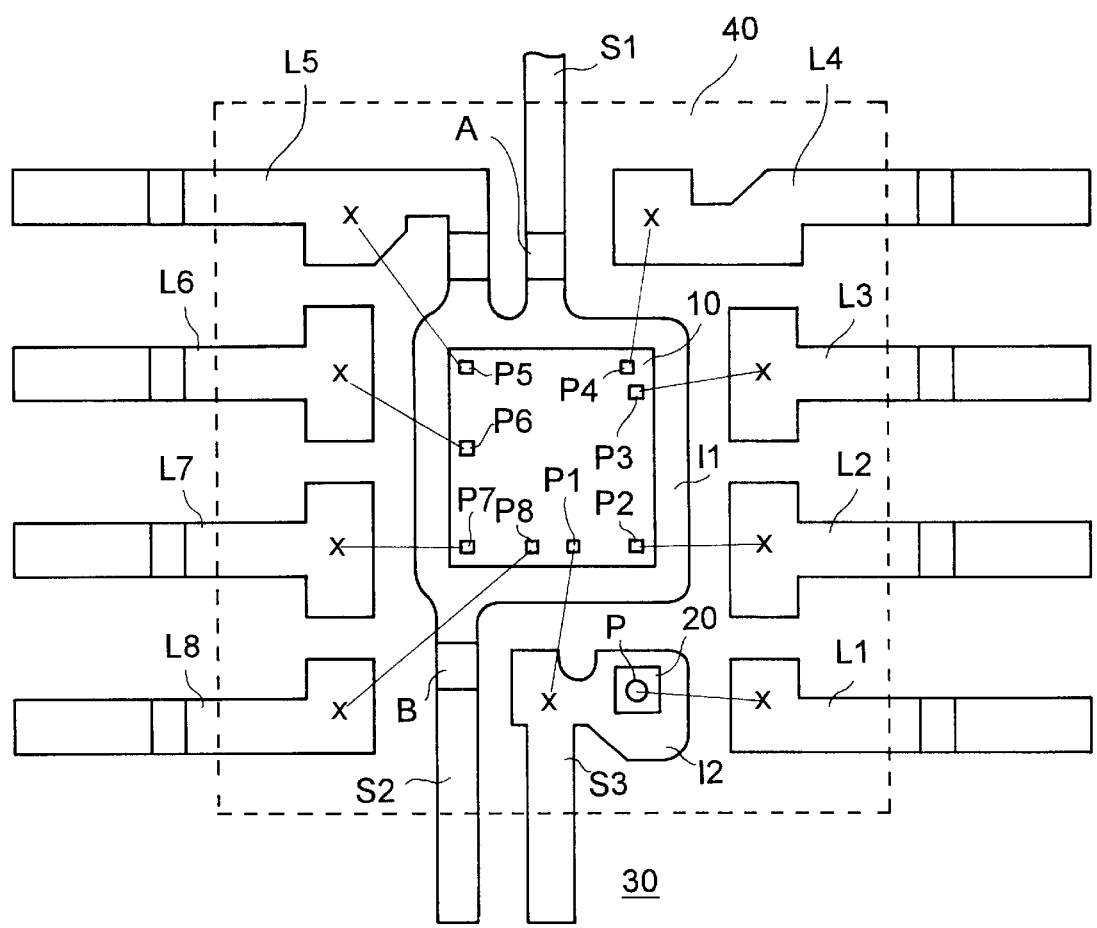
FIG. 1 is a diagram showing the structure inside a package of a motor driving device embodying the invention.

Hereinafter, an embodiment of the present invention will be described with reference to the drawings. FIG. 1 is a diagram showing in detail the structure inside a package 40 of a motor driving device embodying the invention. A leadframe 30 has a first island I1, a second island I2, eight inner leads L1, L2, L3, L4, L5, L6, L7 and L8, and three support bars S1, S2 and S3.

The first island I1 is supported by the support bars S1 and S2, and the second island I2 is supported by the support bar S3. The inner leads L1, L2, L3, L4, L5, L6, L7, and L8 are so formed as to extend out of the package, and are used as terminals. The first island I1 is down-set at portions A and B of the support bars S1 and S2.

Figure 2:
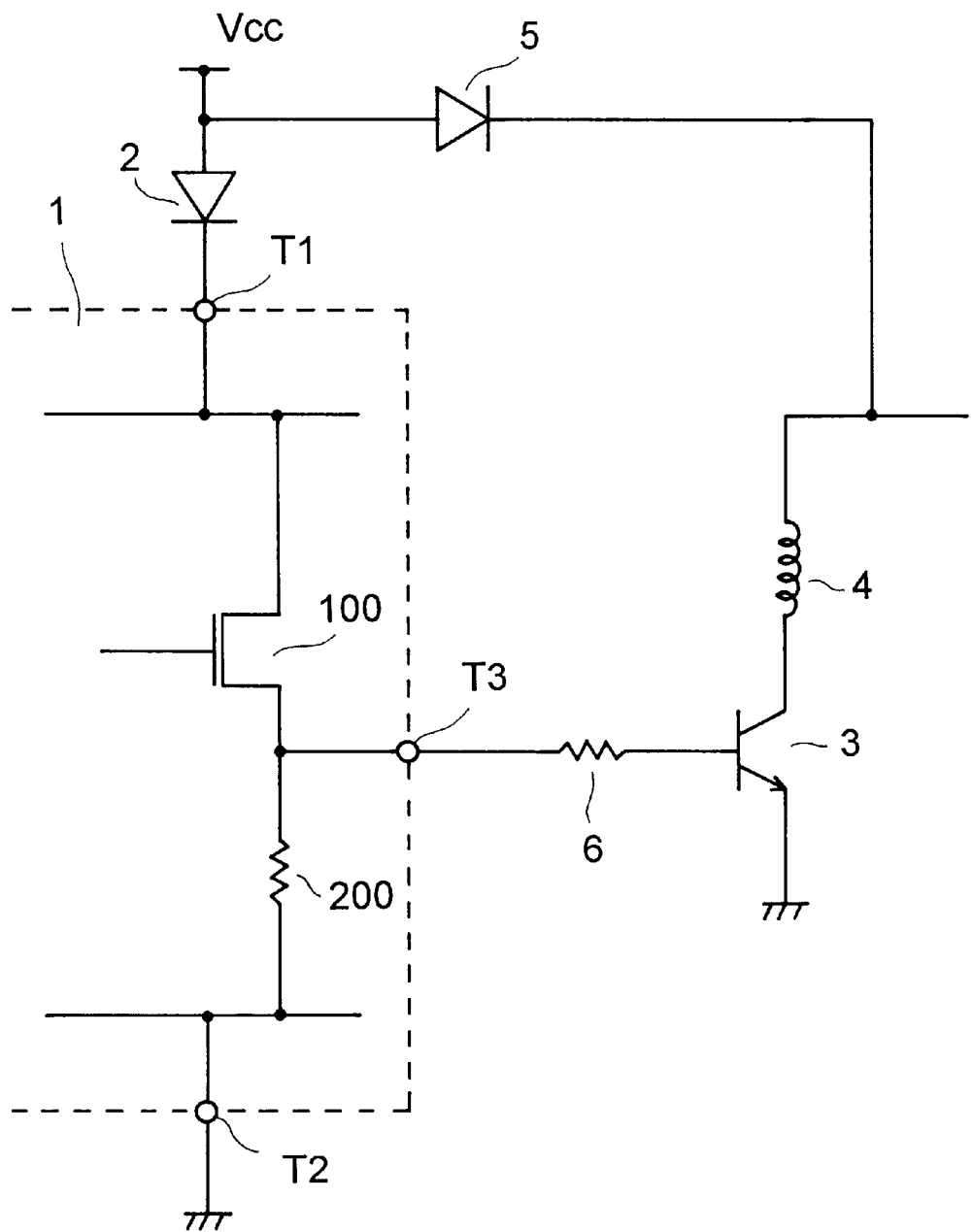
FIG. 2 is a diagram showing an example of a circuit configuration of an output stage of a conventional motor driving device provided with a protection diode.

An IC chip 10 of a drive circuit for driving a motor is die-bonded to the first island I1 of the leadframe 30. A diode chip 20 of a protection diode is die-bonded to the second island I2, so that the second island I2 serves as the cathode electrode of the diode chip 20. The IC chip 10 is, for example, an IC chip of a pre-drive circuit 1 for a two-phase half-wave fan motor that has a circuit configuration as shown in FIG. 2.

On the top surface of the IC chip 10, eight bonding pads P1, P2, P3, P4, P5, P6, P7, and P8 are formed. Of these bonding pads, the supplied-power pad P1, i.e. the one connected to the power-supply line within the IC chip 10, is wire-bonded to the second island I2 (i.e. the cathode electrode of the diode chip 20).

The other pads P2, P3, P4, P5, P6, P7 and P8 are connected to the inner leads L2, L3, L4, L5, L6, L7 and L8 respectively. A bonding pad P that serves as an anode electrode of the diode chip 20 is wire-bonded to the inner lead L1.

As described above, the motor driving device of this embodiment incorporates a drive circuit for driving a motor and a protection diode as separate chips. This eliminates the need to connect a protection diode externally. This in turn makes it possible to reduce the mounting area required and also reduce the number of assembly steps required.

Moreover, it is possible to make the current capacity of a protection diode higher than when it is formed within an IC of a drive circuit. As a result, it is possible to supply a larger amount of current as a motor-driving current, and also make the peak inverse voltage of the protection diode higher. Thus, it is possible to enhance the function of preventing destruction of the circuit.

As described above, according to the present invention, a motor driving device incorporates a drive circuit for driving a motor and a protection diode as separate chips. This eliminates a need to connect the protection diode externally. Thus, it is possible to reduce a the mounting area required and also reduce the number of assembly steps required.

Moreover, it is possible to make the current capacity of the protection diode higher than when it is formed within an IC. As a result, it is possible to supply a larger amount of current as a motor-driving current, and also make the peak inverse voltage of the protection diode higher. Thus, it is possible to enhance the function of preventing destruction of the circuit.

What is claimed is:

1. A motor driving device, comprising:

an IC chip incorporating a circuit for driving a motor;

a diode chip provided in a power-supply path between an external electric power supply and the IC chip, the diode chip having an anode thereof connected to the external electric power supply and a cathode thereof connected to the IC chip in series;

a leadframe having a first island on which the IC chip is mounted and a second island on which the diode chip is mounted;

a wire connecting together a supplied-power pad provided on the IC chip and the second island; and a package incorporating the leadframe, the IC chip, and the diode chip, wherein the diode chip is provided for preventing reverse current from passing through the IC chip when the external power supply is connected thereto with reverse polarities.

2. A motor driving device as claimed in claim 1, wherein a cathode of the diode chip is kept in contact with the second island, and the supplied-power pad of the IC chip is wire-bonded to the second island.

3. A motor driving device, comprising:

an IC chip incorporating a circuit for feeding out control signals to control a motor;

a power-supply path through which power supplied externally is fed to the IC chip for driving the IC chip;

a supplied-power pad provided on the IC chip through which the power is supplied to the IC chip;

a diode chip provided in the power-supply path, and that has an anode thereof connected to the power supplied externally and a cathode thereof connected to the IC chip in series;

a leadframe having a first island on which the IC chip is mounted and a second island on which the diode chip, having the cathode thereof kept in contact with the second island for serving as the power-supply path, is mounted;

a wire connecting together the second island and the supplied-power pad; and a package incorporating the leadframe, the IC chip, and the diode chip, wherein the diode chip is provided for preventing reverse current from passing through the IC chip when the power supplied externally is connected thereto with reverse polarities.

* * * * *